Figures 1, 1A:
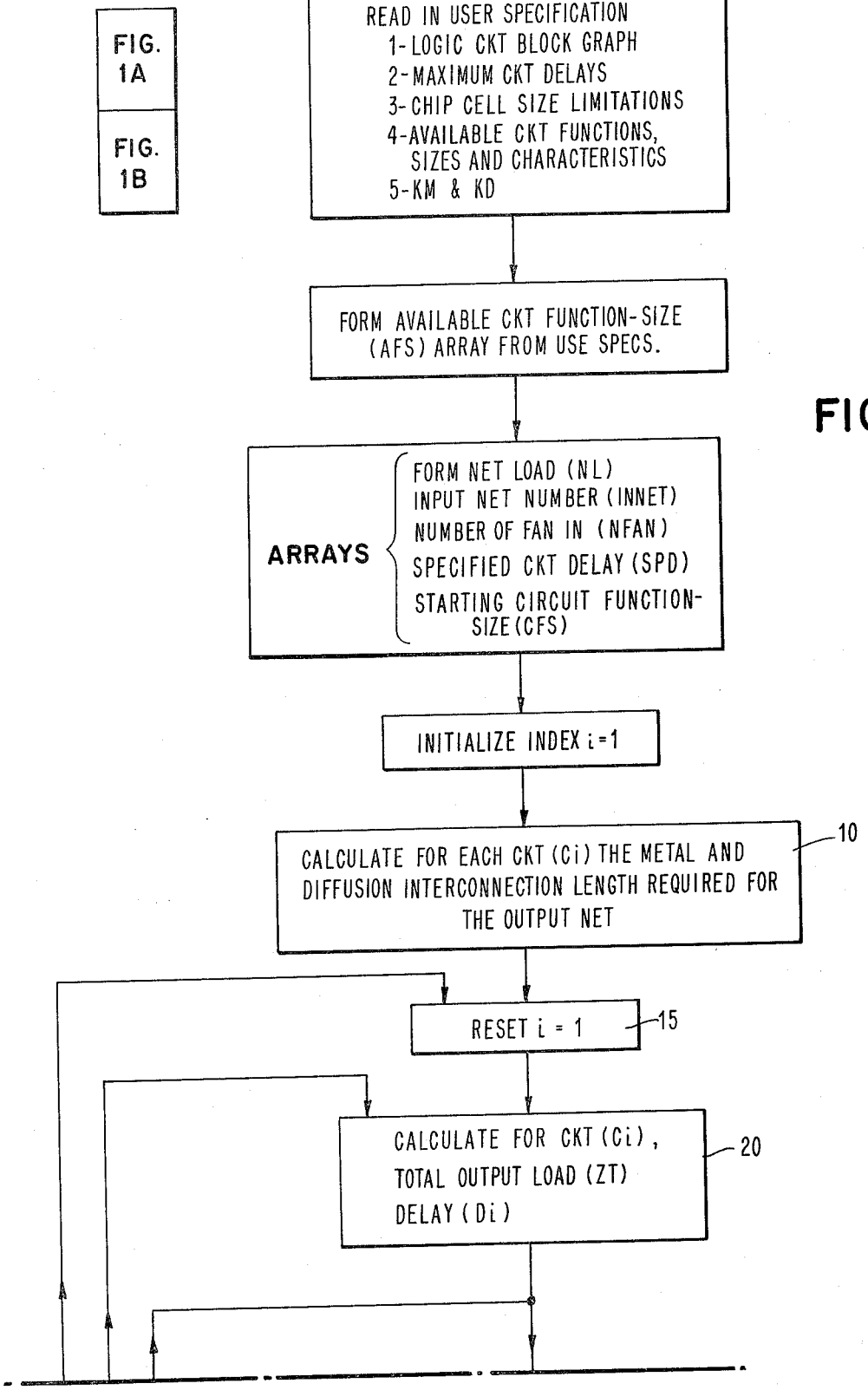
Figure 1B:
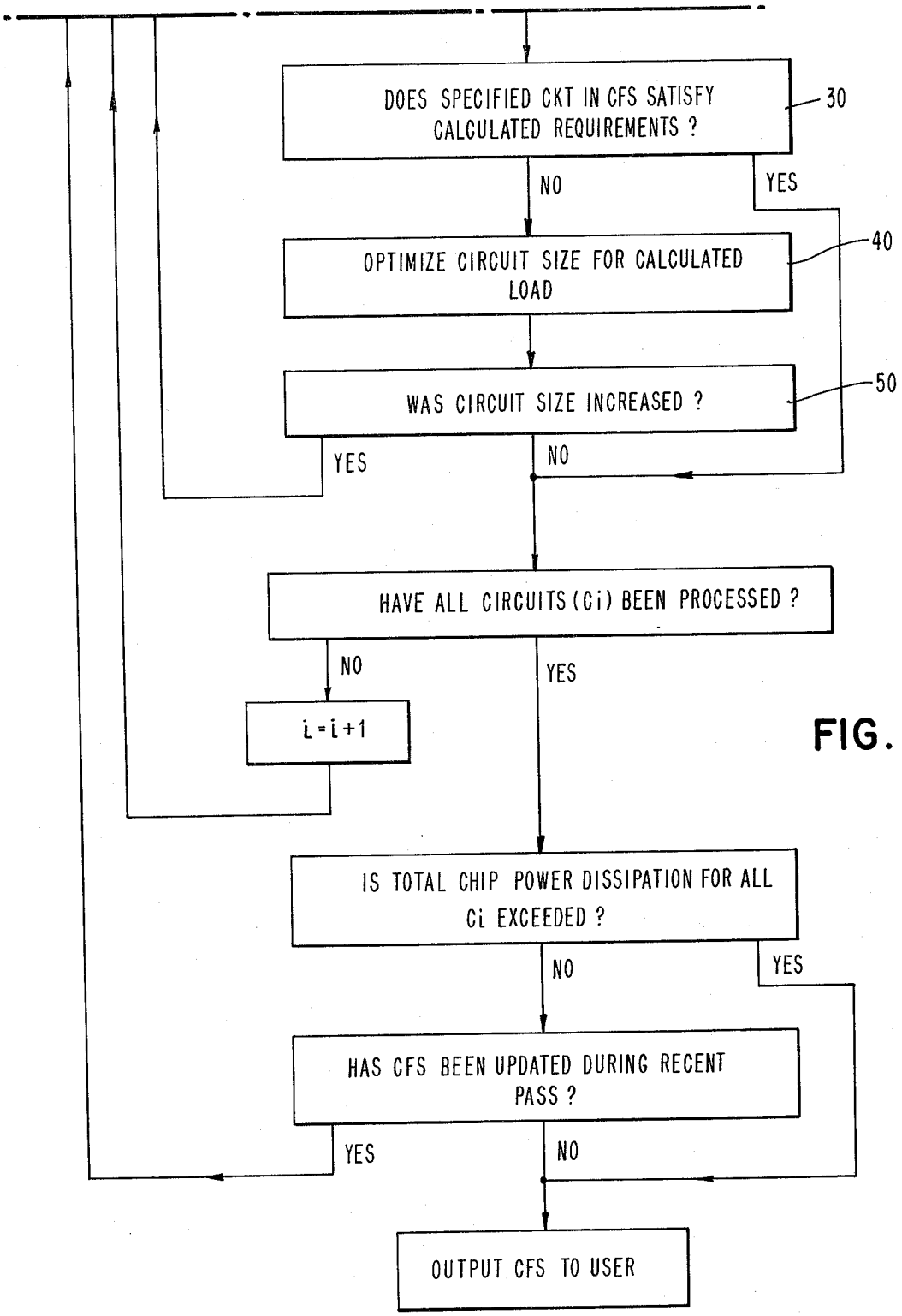
Figure 2:
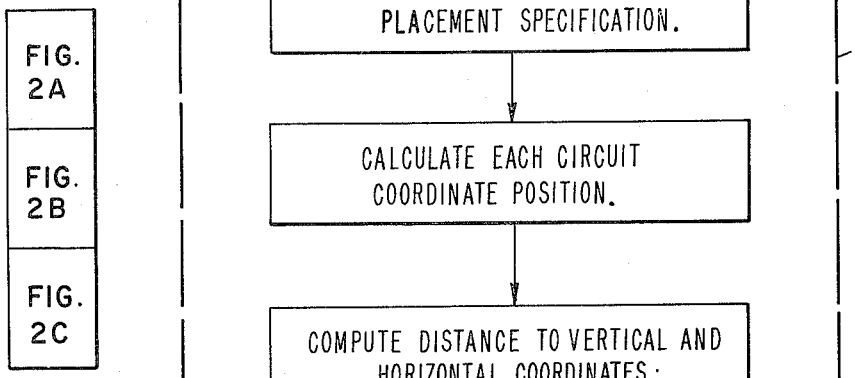
Figure 2:
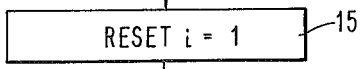
Figure 2A:
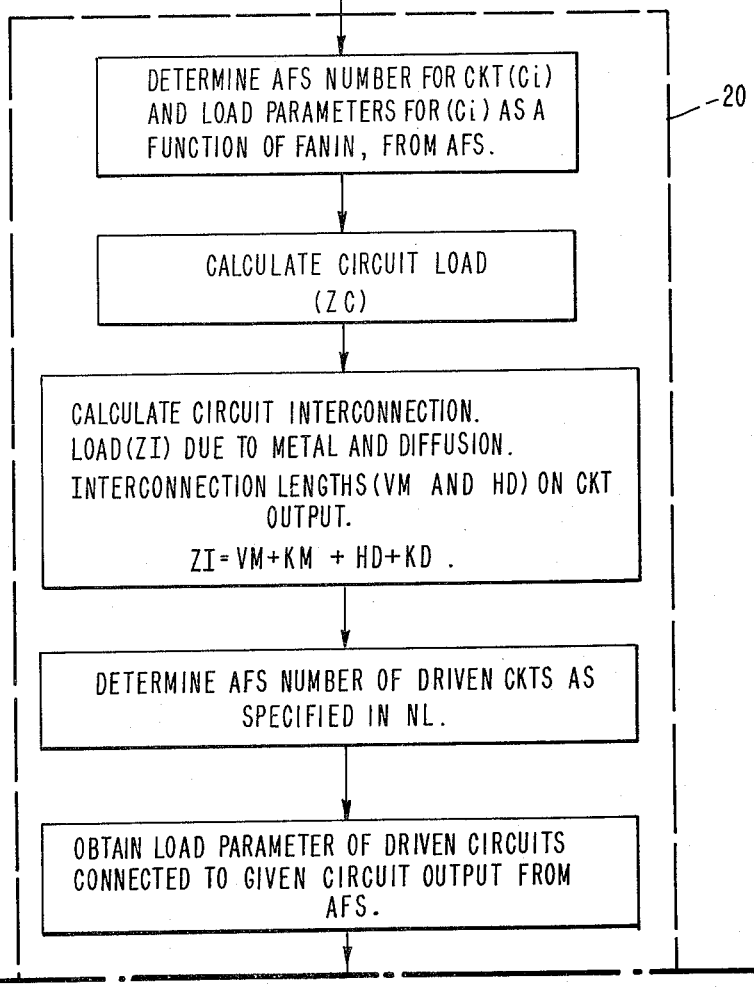
Figure 2B:
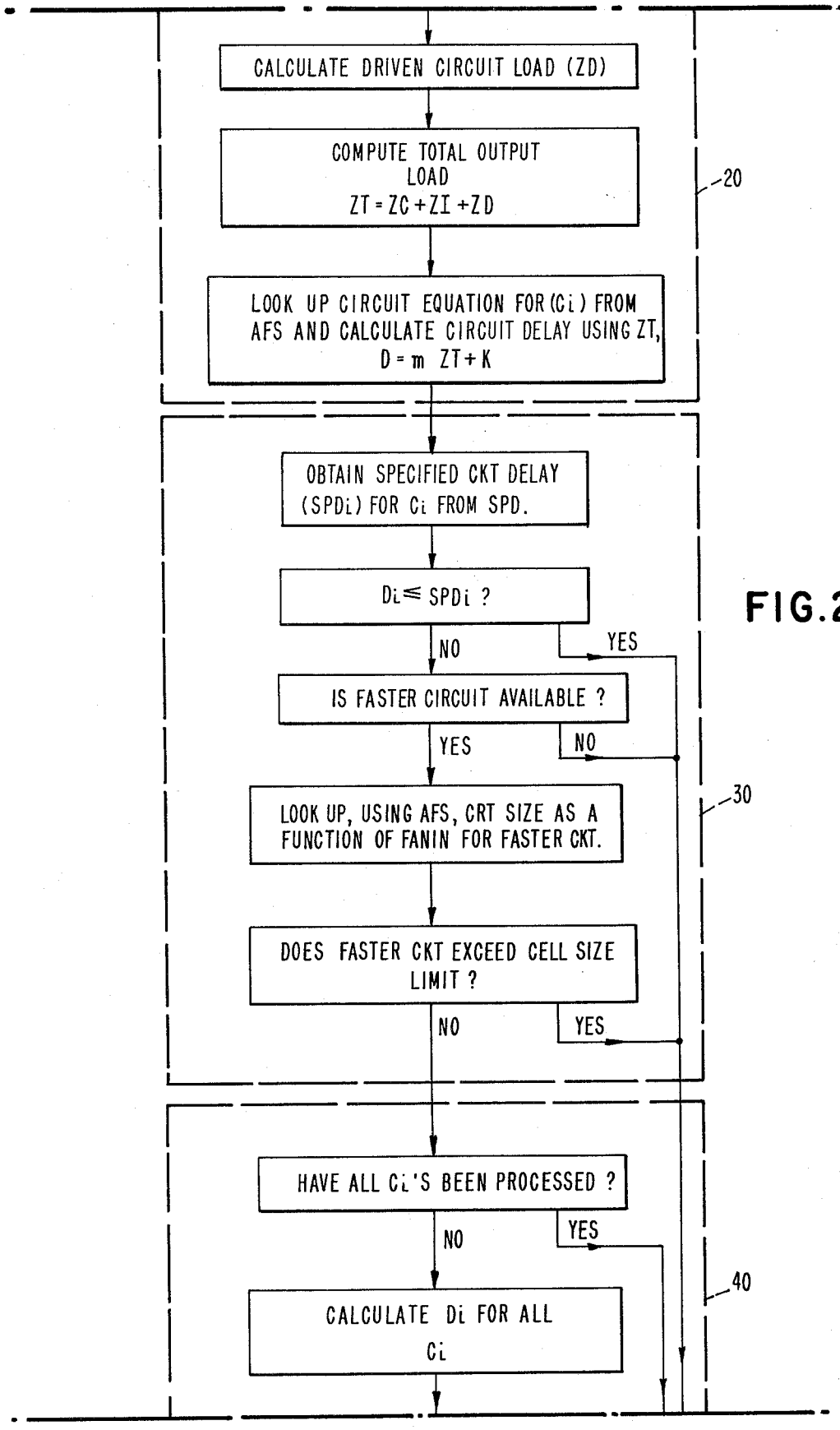
Figure 2C:
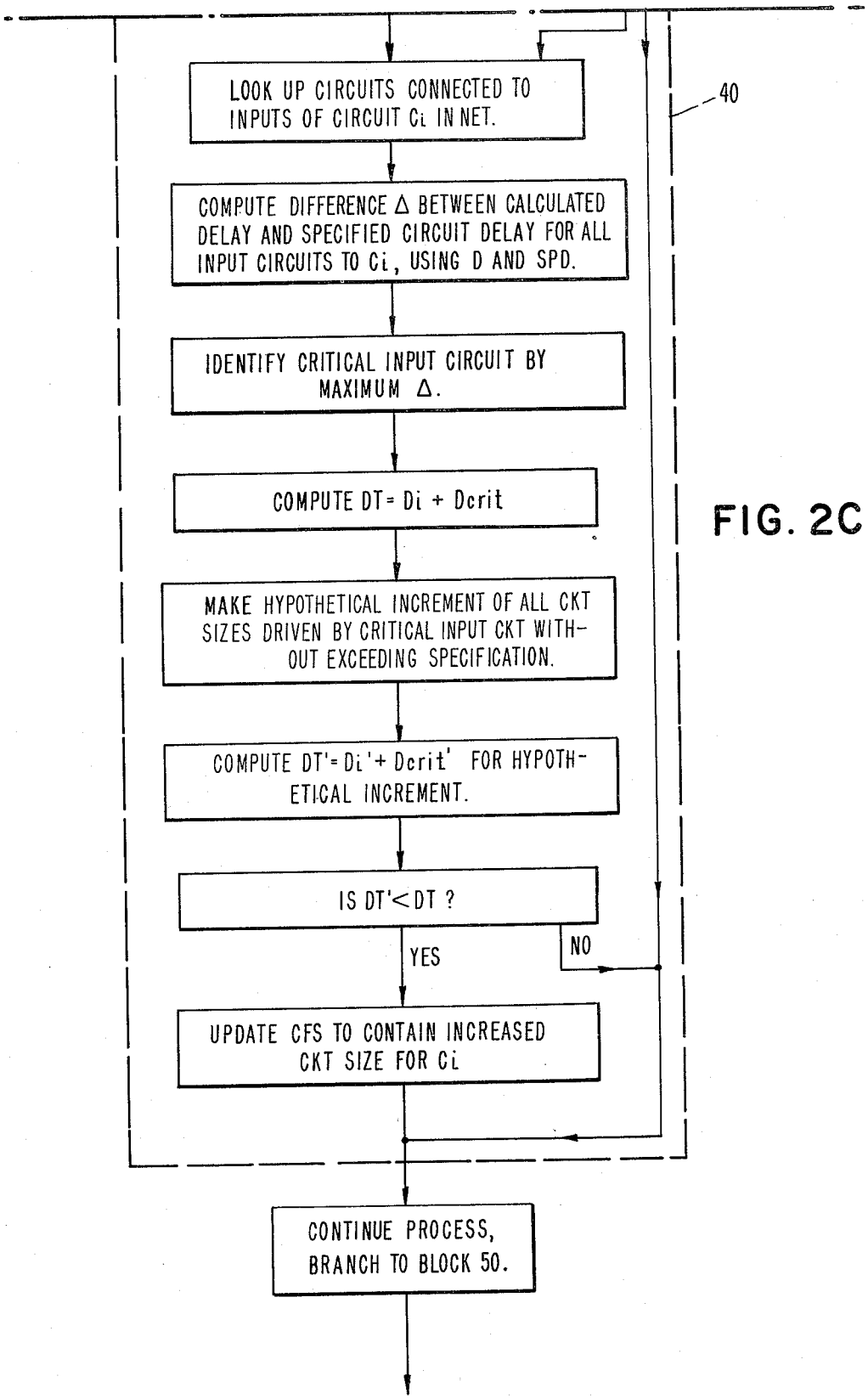
Figure 3:
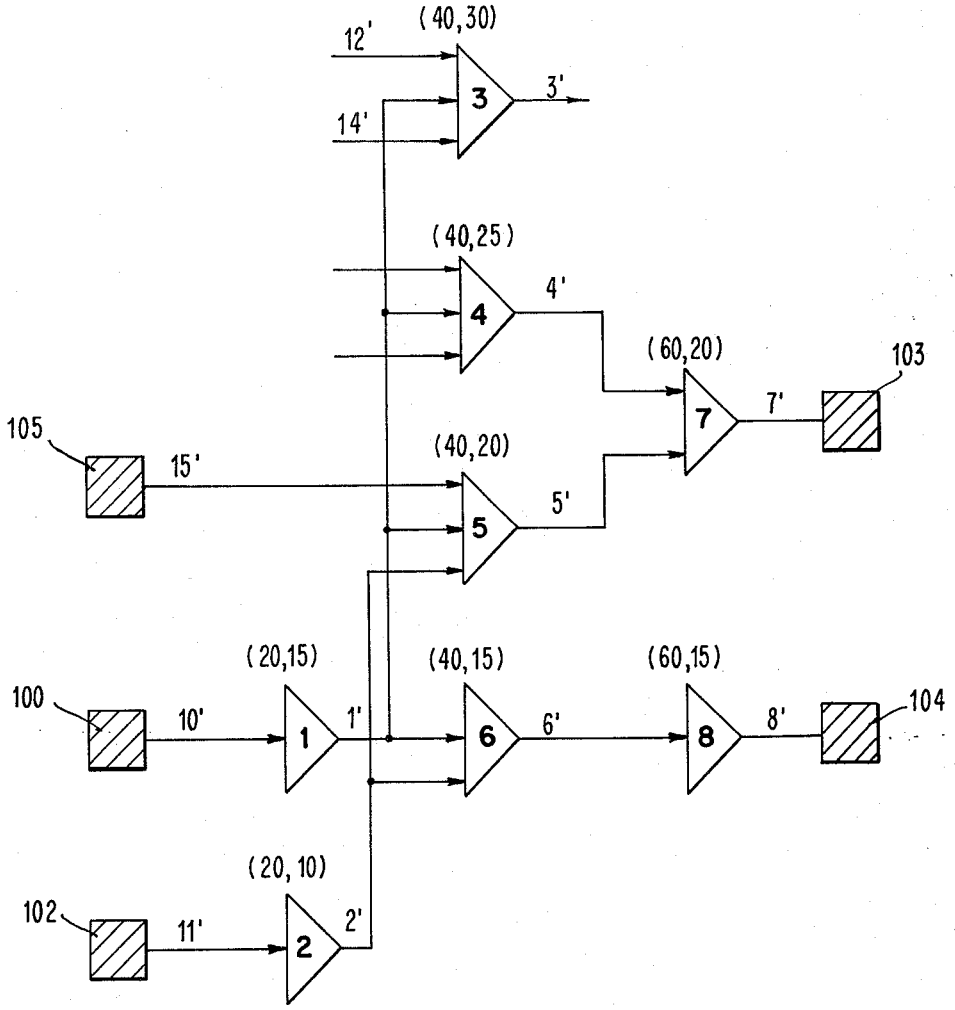

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED JUNE 3, 1975

935 O.G. 9

T935,003

PROCESS FOR SELECTING CIRCUITS WITH OPTIMUM POWER AND AREA REQUIREMENTS

Thomas P. Linville, 2264 Brookside Ave., Yorktown Heights, N.Y. 10598, and Erwin Schischa, Peekskill, Gerhard R. Thompson, Mahopac, N.Y.

Continuation of abandoned application Ser. No. 214,143, Dec. 30, 1971. This application Feb. 19, 1974, Ser. No. 443,268

Int. Cl. G06f *15/06, 15/56*

U.S. Cl. 444—1

7 Sheets Drawing. 27 Pages Specification

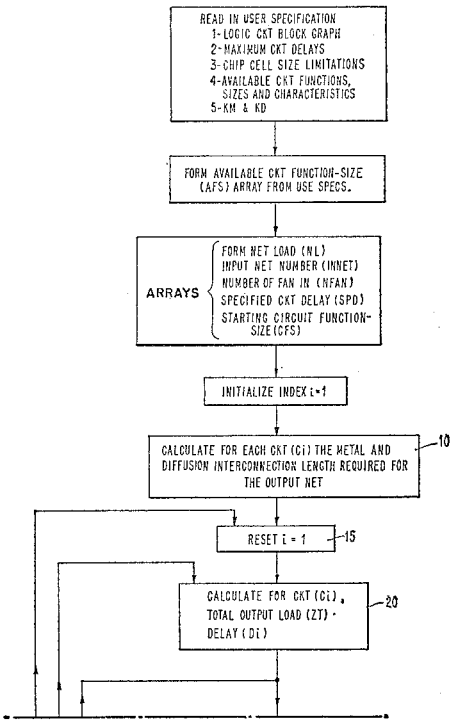

This is an automatic process for selecting circuits to be placed on a large scale integrated (LSI) circuit chip. The process selects a minimum circuit size which satisfies the power and timing requirements of the individual circuits on the chip. Minimization is achieved by selecting from user specification lists, that circuit which satisfies the requirements. The large scale integrated circuit chip resulting from the design process contains field effect transistor circuits of different physical size. By matching the required power and timing with a satisfactory circuit, the LSI chip is more highly compacted in the number of circuits and performance available within the chip structure.

ERRATA

In the notices of Defensive Publications appearing on pages 9–12 in the Official Gazette of June 3, 1975, the names of the assignees were omitted and should be added as indicated below:

T935,001. E. 1. du Pont de Nemours and Company, Wilmington, Del.
T935,002. Pacific Lighting Service Co., Los Angeles, Calif.
T935,003. International Business Machines Corporation, Armonk, N.Y.
T935,004. International Business Machines Corporation, Armonk, N.Y.
T935,005. International Business Machines Corporation, Armonk, N.Y.
T935,006. E. I. du Pont de Nemours and Company, Wilmington, Del.

In the notices of Defensive Publications appearing on pages 7 and 8 in the Official Gazette of July 1, 1975, the following names of assignees were omitted and should be added:

T936,001. E. I. du Pont de Nemours and Company, Wilmington, Del.
T936,002. E. I. du Pont de Nemours and Company, Wilmington, Del.
T936,005. Du Pont of Canada Limited, Quebec, Canada

CIRCUIT BLOCK GRAPH

FIG. 4

| ADDRESS | m | K | LOAD-IN | ZC1 | ZC2 | PWR. | SIZE PARAMETER | MAX. CELL SIZE |
|---|---|---|---|---|---|---|---|---|
| A1 | 30 | 5 | .5 | .75 | .07 | .5 | 3 | 40 |
| A2 | 20 | 5 | .65 | .85 | .12 | .9 | 4 | 40 |
| A3 | 0 | 0 | 0 | 0 | 0 | 0 | 0 | 0 |
| A4 | 2.2 | 0 | 2.9 | 17 | .2 | .8 | 6 | 30 |
| A5 | 1.6 | 0 | 4.7 | 185 | .3 | 1.4 | 9 | 30 |
| ⋮ | ⋮ | ⋮ | ⋮ | ⋮ | ⋮ | ⋮ | ⋮ | ⋮ |
| Aℓ | ℓ1 | ℓ2 | ℓ3 | ℓ4 | ℓ5 | ℓ6 | ℓ7 | ℓ8 |

AFS ARRAY

FIG. 5

| | NL ARRAY | | INNET ARRAY | NFAN ARRAY | SPD ARRAY | CFS ARRAY | CELL POSITION ARRAY |
|---|---|---|---|---|---|---|---|
| CKT. NO. | NET NO. | DRIVEN CKTS. | NET NO. | NO. OF INPUTS | DELAY | AFS ADDRESS | x,y COORDINATE POSITION |
| 1 | 1 | 3,4,5,6 | 10 | 1 | 125 | A1 | 20,15 |
| 2 | 2 | 5,6 | 11 | 1 | 125 | A1 | 20,10 |
| 3 | 3 | · | 12,1,14 | 3 | 200 | A1 | 40,30 |
| 4 | 4 | · | · | 3 | 125 | A1 | 40,25 |
| 5 | 5 | 7 | 12,15 | 3 | 125 | A1 | 40,20 |
| 6 | 6 | 8 | 1,2 | 2 | 125 | A1 | 40,15 |
| 7 | 7 | · | 4,5 | 2 | 50 | A4 | 60,20 |
| 8 | 8 | · | 6 | 1 | 50 | A4 | 60,15 |

CIRCUIT BLOCK GRAPH INPUT